(12) United States Patent
Ohsumi

(10) Patent No.: US 6,331,449 B1
(45) Date of Patent: *Dec. 18, 2001

(54) METHOD OF FORMING A DICING AREA OF A SEMICONDUTOR SUBSTRATE

(75) Inventor: Takashi Ohsumi, Tokyo (JP)

(73) Assignee: Oki Electric Industry Co., Ltd., Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/172,150

(22) Filed: Oct. 14, 1998

(30) Foreign Application Priority Data

Dec. 26, 1997 (JP) .................................................. 9-360293

(51) Int. Cl.⁷ .................................................... H01L 21/44
(52) U.S. Cl. .......................... 438/113; 438/458; 438/462
(58) Field of Search ..................................... 257/620, 797; 438/113, 458, 462, 725

(56) References Cited

U.S. PATENT DOCUMENTS

| | | | |
|---|---|---|---|
| 4,967,259 | * | 10/1990 | Takagi . |
| 5,132,252 | * | 7/1992 | Shiraiwa et al. . |
| 5,399,462 | * | 3/1995 | Sachdev et al. . |
| 6,022,792 | * | 2/2000 | Ishii et al. ............................ 438/462 |
| 6,046,101 | * | 4/2000 | Dass et al. ............................ 438/624 |

* cited by examiner

Primary Examiner—Caridad Everhart
(74) Attorney, Agent, or Firm—Volentine Francos, PLLC

(57) ABSTRACT

A semiconductor substrate is provided having a principal surface which includes a plurality of device areas separated by at least one dicing area. The at least one dicing area includes at least one each of a test device and a measuring mark, and each of the test device and the measuring mark includes a plurality of closely adjacent projections defining a narrow depression therebetween. In one aspect, each narrow depression defined by the closely adjacent projections of each of the test device and the measuring mark is covered with a protective film prior to dicing. In another aspect, the projections are etched either wholly or partially away to eliminate or reduce the size of the narrow depression prior to dicing. In yet another aspect, the narrow depression is filled with a metal film and then a low viscosity resist, prior to application of a high viscosity resist and then later dicing.

3 Claims, 5 Drawing Sheets

METHOD OF FORMING A DICING AREA OF A SEMICONDUTOR SUBSTRATE

BACKGROUND OF THE INVENTION

1. Field of the Invention

This invention relates to a structure of a semiconductor device and a method of manufacturing the semiconductor device, and particularly to a semiconductor device having bump electrodes formed by electroplating.

2. Description of the Related Art

Bump electrodes correspond to protruded electrodes formed over bonding pads and wires of a semiconductor integrated circuit to connect a semiconductor substrate with the semiconductor integrated circuit formed thereon and a substrate, a film carrier and a lead frame or the like opposite to the semiconductor substrate to one another. As methods of manufacturing the bump electrodes, there are known electroplating, ball bonding, etc. In particular, the electroplating is excellent in fine-pitch formation and mass productivity of the bump electrodes and is in the mainstream of a bump forming technique typified by gold bump electrodes at present.

A structure on the semiconductor substrate for forming the bump electrodes thereon will now be described.

A semiconductor integrated circuit is formed on the semiconductor substrate. The surface of the semiconductor integrated circuit is covered with a surface protective film such as a silicon oxide film, a silicon nitride film or the like. By using photolithography and etching, openings are defined in portions where the bump electrodes are formed.

In the semiconductor integrated circuit, a lithography technique using a reduction projection exposure system is used in its forming process to micro-fabricate patterns. For the reason of a reduction in manufacturing cost in this case, an electric characteristic evaluating element, pattern formation accuracy measuring marks, mask alignment marks, etc. necessary for quality control on the forming process of the semiconductor integrated circuit are inserted into a dicing area for dividing the semiconductor substrate into IC chips. However, the existence of a hard and thick surface protective film or the like in the dicing area, which constitutes structures of the electric characteristic evaluating element, pattern formation accuracy measuring marks, mask alignment marks, etc. is undesired in the subsequently-executed dicing process for dividing the semiconductor substrate into IC chips to wear the blade of a dicing saw. Thus, such a contrivance that parts other than the electric characteristic evaluating element are removed and no load is placed on the dicing process, is put on the surface protective film or the like.

A general method for forming gold bump electrodes by electroplating will now be described.

The aforementioned semiconductor substrate for forming bump electrodes is first prepared. A metal thin film, which serves as a bed used for each bump electrode, is formed over the semiconductor substrate. The metal thin film functions so as to provide adhesion to the semiconductor substrate and the prevention of diffusion thereof into a wired metal constituting the semiconductor integrated circuit and serves as a path for supplying a plating current upon formation of each bump electrode.

Next, a resist film having openings for determining a plating shape or configuration of each bump electrode is formed over the metal thin film. Although the resist film is generally formed by the lithography technique, it is different from a resist film used to form a semiconductor integrated circuit structure. As the resist film, a high viscosity resist is applied relatively thick so as to range from about 20 $\mu$m to 50 $\mu$m in thickness and then cured by the normal heat treatment.

A plating current is next supplied to the metal thin film on the semiconductor substrate, which has been immersed in a plating solution to thereby deposit plated deposits within the openings of the resist film on the semiconductor substrate so as to form the bump electrodes.

The resist film is next removed by a resist release agent. With the formed plated deposits as masks, the metal thin film on the semiconductor substrate is etched. Thereafter, heat treatment or the like is performed as needed so that bump electrode structures are formed.

SUMMARY OF THE INVENTION

With the foregoing in view, it is therefore an object of the present invention to provide a semiconductor device capable of restraining the destruction of a resist due to fine projections and depressions formed on a dicing area upon subsequent heat treatment or the like even when the projections and depressions are formed on the dicing area.

According to one aspect of this invention, for achieving the above object, there is provided a semiconductor device, comprising:

a plurality of device areas;

at least one dicing area indicative of an area for dividing the device areas into pieces;

areas each including projections and depressions formed in the dicing area; and covering layers each covering the areas including the projections and depressions.

Typical ones of various inventions of the present application have been shown in brief. However, the various inventions of the present application and specific configurations of these inventions will be understood from the following description.

BRIEF DESCRIPTION OF THE DRAWINGS

While the specification concludes with claims particularly pointing out and distinctly claiming the subject matter which is regarded as the invention, it is believed that the invention, the objects, features and advantages thereof will be better understood from the following description taken in connection with the accompanying drawings in which:

DETAILED DESCRIPTION OF THE PREFERRED EMBODIMENTS

Figure 1:
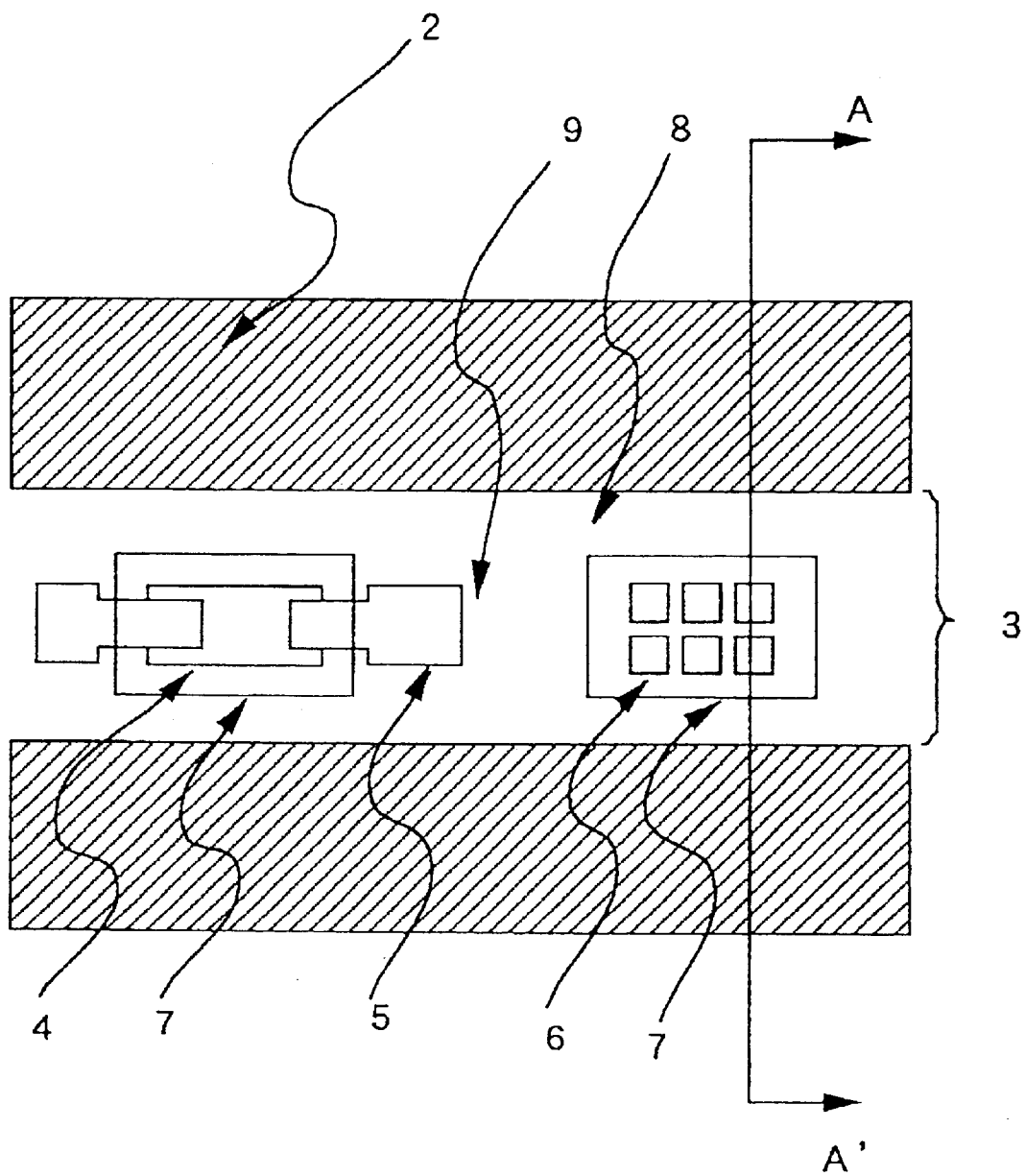
FIG. 1 is a plan view showing a first embodiment of the present invention.

Preferred embodiments of the present invention will hereinafter be described with reference to the accompanying drawings. FIG. 1 and FIGS. 2(a) through 2(d) are respectively views for describing a first embodiment of the present invention. FIG. 1 is a plan view and FIGS. 2(a) through 2(d)

are respectively process drawings shown using a cross-sectional view taken along line A–A' of FIG. 1.

Figure 2:
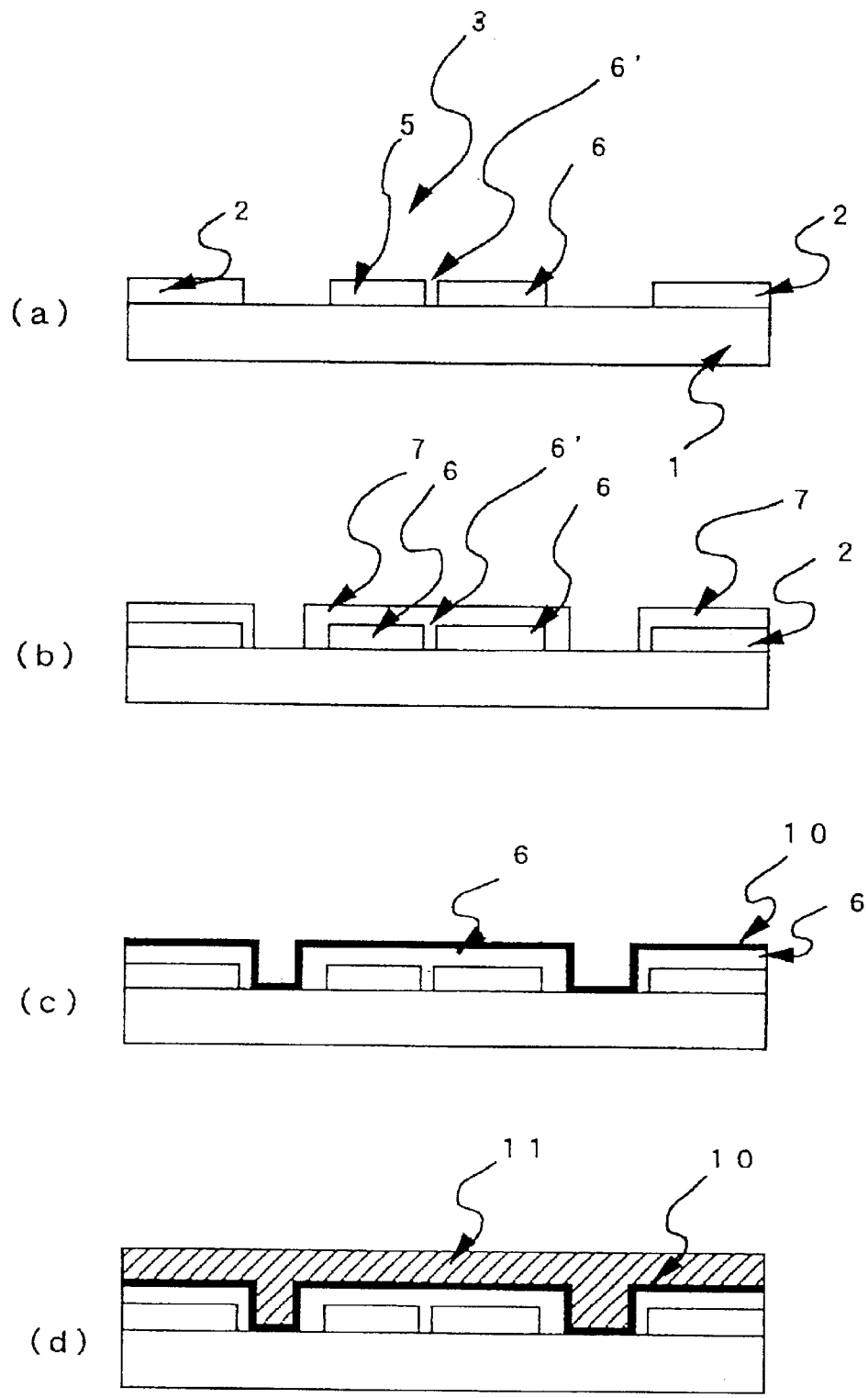
FIG. 2 is a flow chart illustrating the first embodiment shown in FIG. 1.

In the invention of the present application, a plurality of device areas 2 with circuit elements formed therein, and a dicing area 3 lying between these device areas 2 and for dividing the device areas 2 into pieces are formed over a wafer 1 as shown in FIGS. 1 and 2. Further, an electric characteristic evaluating device 4 and electrodes 5 used therefor, pattern formation accuracy measuring marks 6 used for reduction projection exposure, etc. are formed over the dicing area 3. Surface protective coats or films 7 are formed over the electric characteristic evaluating device 4 and the pattern formation accuracy measuring marks 6.

Here, each of the surface protective films 7 is formed so that surface protective film non-formation areas 8 having predetermined intervals are provided between the device areas 2 and the surface protective film 7. The provision of the surface protective film non-formation areas 8 in this way allows restraint on a malfunction that cracks or the like are produced in protective films for covering the device areas upon division of the device areas 2 into pieces.

Further, the surface protective films 7 may preferably be formed only on portions having fine or microscopic irregularities or projections and depressions, of the electric characteristic evaluating device 4 and the pattern formation accuracy measuring marks 6. Since the hard and thick surface protective films exist in a dicing area defined as the minimum area if they are formed in this way, a dicing blade will not be worn beyond the need upon dicing.

A process for manufacturing the semiconductor device shown in FIG. 1 will next be described with reference to FIGS. 2(a) through 2(d).

FIG. 2(a) shows a wafer 1 on which a plurality of device areas 2 with circuit elements formed therein, at least one dicing area 3 provided between the device areas 2, and pattern formation accuracy measuring marks 6 having fine or microscopic projections and depressions formed in the dicing area are formed.

Next, surface protective films 7 each composed of, for example, a nitride film or a PSG film are respectively formed over only the device areas 2 and e.g., the pattern formation accuracy measuring marks 6 used as patterns having the fine projections and depressions formed in the dicing area as shown in FIG. 2(b) by using the known CVD method and the photolithographic etching method.

After the formation of such surface protective films 7, a metal film 10 used as a conductive layer upon forming bumps by electroplating, e.g., a film composed of nickel, tungsten, palladium, titanium and their complex construction is formed over the entire surface of a semiconductor substrate as shown in FIG. 2(c) by vapor deposition or sputtering.

Thereafter, a resist layer 11 having unillustrated openings in bump forming areas is formed over the entire surface of the wafer 1 as shown in FIG. 2(d). Further, bumps are formed over the conductive layer bare in the openings by electroplating.

Thereafter, the resist layer 11 is removed by a resist release agent. The metal thin film on the semiconductor substrate is removed by etching with plated deposits used as the formed bump electrodes as masks. Thereafter, the dicing area from which the resist and metal film have been removed, is cut by a dicing blade so that the respective device areas are divided into pieces.

In the first embodiment as described above, the metal film 10 and the resist film 11 are formed after the surface protective film 7 has been formed over, e.g., the pattern formation accuracy evaluating marks 6 having the fine projections and depressions. Therefore, since fine clearances 6' between the pattern formation accuracy evaluating marks 6 are blocked by the corresponding surface protective film 7, air drawn or taken upon formation of the resist film 11 and gas generated by vaporization of a resist's solvent are hard to accumulate in the fine clearances. Thus, inconvenience can be solved that the gas is expanded by the subsequent heat treatment or the like so that the resist film is destroyed.

In the first embodiment as well, the surface protective film 7 may be formed to a film thickness of such an extent that the electric characteristic evaluating device 4 and the fine projections and depressions of the pattern formation accuracy measuring marks 6 are blocked, e.g., a film thickness of about 1 $\mu$m with the same material simultaneously with the nitride film or PSG film used as the surface protective film covering the semiconductor element 1. In this case, the surface protective film 7 can be formed without additionally providing a special process.

A second embodiment according to the invention of the present application will next be described with reference to FIGS. 3(a) through 3(d). The same parts of structure as those employed in the first embodiment are identified by the same reference numerals and their description will be omitted.

Figure 3:
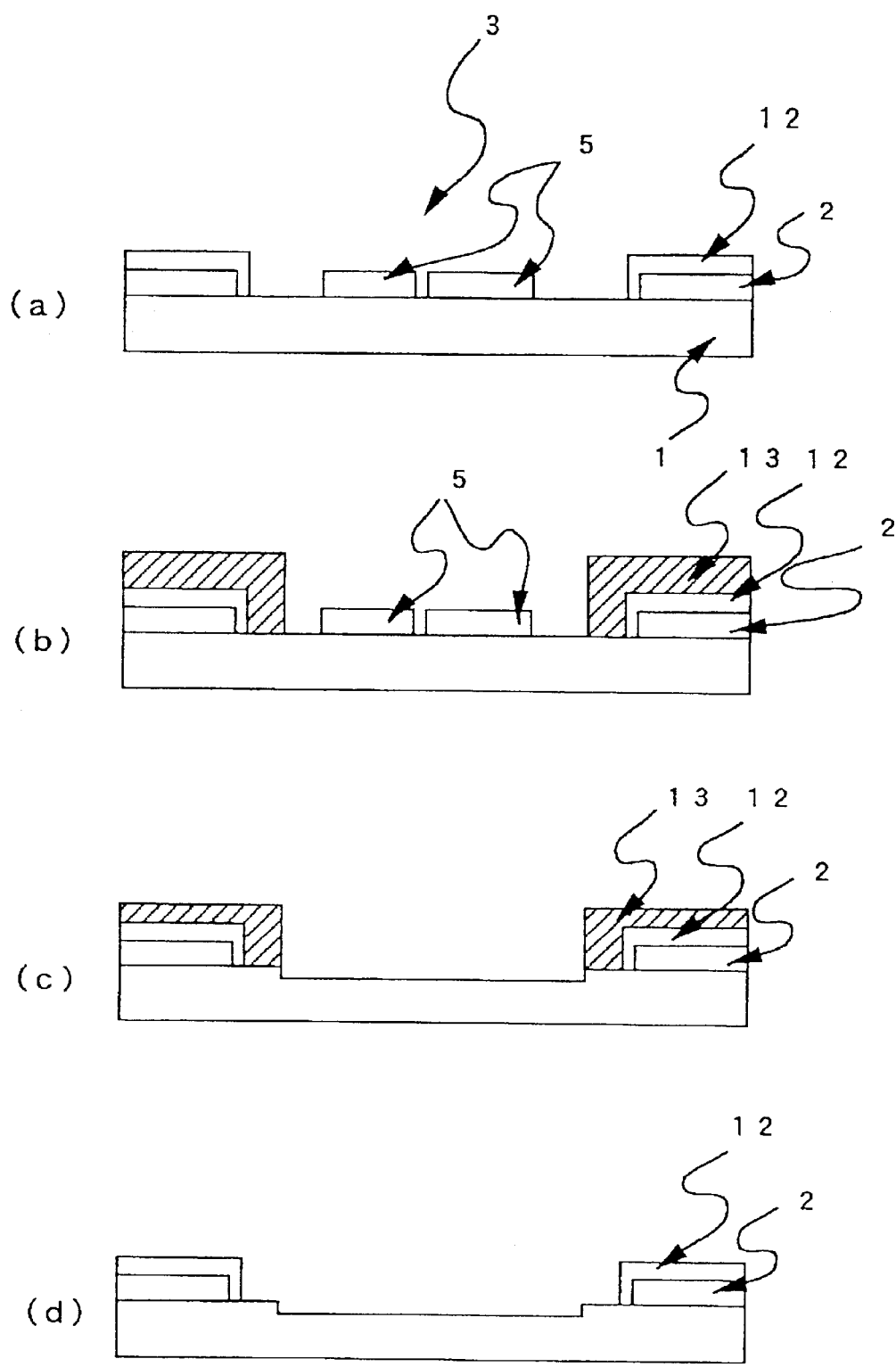
FIG. 3 is a flow chart depicting a second embodiment of the present invention.

FIG. 3(a) shows a wafer 1 on which a plurality of device areas 2 with circuit elements formed therein, protective films 12 composed of, for example, a silicon nitride film, which are formed over the surfaces of these device areas, at least one dicing area 3 provided between these device areas, and pattern formation accuracy measuring marks 6 having fine or microscopic projections and depressions formed in the dicing area are formed.

Next, a masking material 13 such as a resist or the like is formed over each of the device areas 2 as shown in FIG. 3(b).

The pattern formation accuracy measuring marks 6 are next removed by wet etching using hydrofluoric acid or the like or by dry etching with the resist 13 as a mask as shown in FIG. 3(c).

Thereafter, the resist 13 is removed (see FIG. 3(d)) and a metal film and a resist film are formed in a manner similar to the first embodiment to form bumps.

Now, the resist 13 is formed to thicknesses ranging from about 1 to 2 $\mu$m and in a viscosity range from about 30 to 60 cp so as not to give losses to the device areas 2 when the pattern formation accuracy measuring marks 6 are removed by etching.

When the etching is excessively performed upon removal of the pattern formation accuracy measuring marks 6 by etching as shown in FIG. 3(c), the semiconductor substrate is etched so that the thickness thereof becomes thin, whereby the blade of a dicing saw can be reduced in wear upon dicing.

Figure 4:
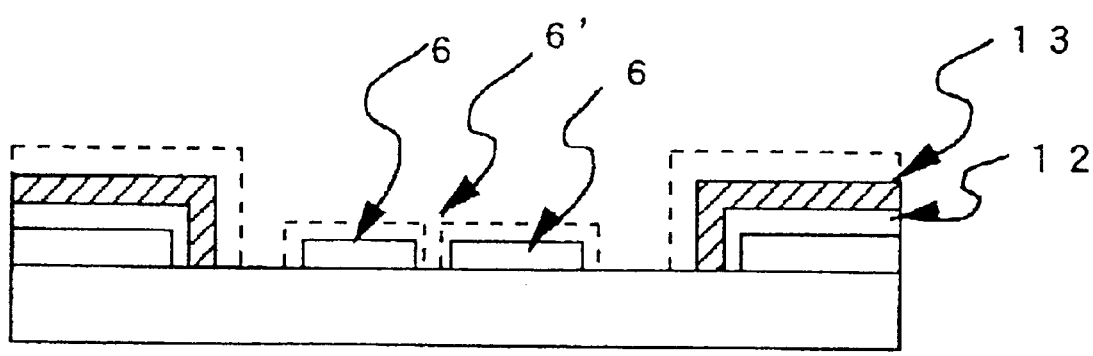
FIG. 4 is a view showing a modification of the second embodiment shown in FIG. 3.

When the fine projections or depressions formed in the pattern formation accuracy measuring marks 6 are etched by wet etching using the hydrofluoric acid or the like or by dry etching or the like, they may simply be etched up to a completely non-removed state as shown in FIG. 4.

Owing to the partial etching in this way, the fine projections and depressions formed in the pattern formation accuracy measuring marks 6 are shallow in depth and become gradually smooth. Therefore, clearances 6' defined between the fine projections and depressions become wide.

Thereafter, the remaining resist 13 is removed and a metal film and a resist film are formed in a manner similar to the first embodiment to form bumps.

Since the fine projections and depressions are shallow in depth and become gently sloped and the clearances 6' formed therebetween become wide in this way, the resist film can be formed without allowing gas to remain in the clearances 6' defined by the fine projections and depressions when the metal film and the resist film are formed in accordance with the subsequent process. Since the partial etching is simply performed without completely removing the fine projections and depressions, an etching time interval can be shortened.

A third embodiment of the invention of the present application will next be explained with reference to FIGS. 5(a) through 5(d). The same parts as those employed in the first embodiment are identified by the same reference numerals and their description will be omitted.

Figure 5:
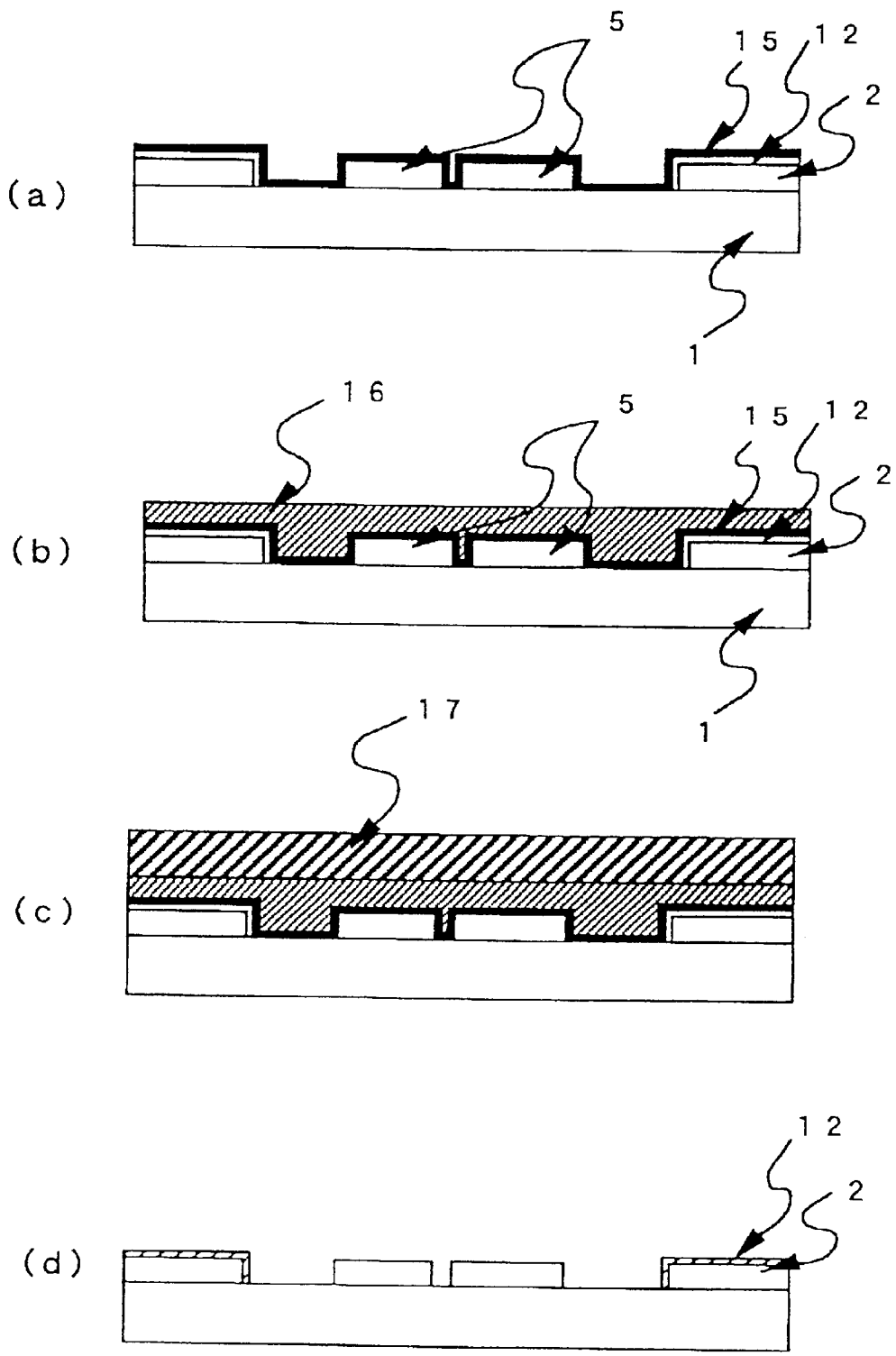
FIG. 5 is a flow chart illustrating a third embodiment of the present invention.

FIG. 5(a) illustrates a wafer 1 on which a plurality of device areas 2 with circuit elements formed therein, protective films 12 composed of, for example, a silicon nitride film, which are formed over the surfaces of these device areas, at least one dicing area 3 provided between these device areas, and pattern formation accuracy measuring marks 6 having fine or microscopic projections and depressions formed in the dicing area are formed. A metal film 15, which serves as a bed for bump electrodes, is formed over the entire surface of the wafer 1. Since the metal film 15 is formed to a thickness of about 1 $\mu$m, the fine projections and depressions of the pattern formation accuracy measuring marks 6 cannot be blocked completely.

Next, a first resin 16 is formed over the entire surface of the metal film 15 as shown in FIG. 5(b). In order to completely block the fine projections and depressions of the pattern formation accuracy measuring marks 6, a low-viscosity resist material is used as the first resin film 16. The use of the low-viscosity resist material allows the complete blocking of the fine projections and depressions and makes it easy to diverge vaporized gas of a solvent, which is produced upon resist's curing, into the outside of the resist film.

A resist film 17 corresponding to a second resin film is then applied onto the entire surface of the first resin film 16 as shown in FIG. 5(c). The second resin film is cured after having been applied to a thickness enough to determine a plating configuration or shape of each bump electrode, e.g., thicknesses ranging from about 20 $\mu$m to 50 $\mu$m. Since the second resin film is formed thick in this way, one different from the first resin film and high in viscosity is used as the second resin film. In the prior art in this case, the high-viscosity resist material does not enter the fine projections and depressions formed in the dicing area and the resist film is destroyed by the solvent-based vaporized gas produced upon curing. However, since the low-viscosity first resist material lies below the high-viscosity resist material and the fine projections and depressions are buried and flattened by the first resist material in the third embodiment, no inconvenience occurs.

Thereafter, as shown in FIG. 5(d), the metal film 15 on the semiconductor substrate, which has been immersed in a plating solution, is supplied with a plating current to deposit plated deposits within resist openings on a semiconductor substrate so as to form bump electrodes. Further, both the resist films used as the first and second resin films are removed by a resist release agent and the metal film 15 on the semiconductor substrate is etched with the formed plated deposits as masks. Thereafter, heat treatment or the like is performed as needed so that bump electrode structures are formed.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A method of manufacturing a semiconductor device, comprising:

providing a semiconductor substrate having a principal surface which includes a plurality of device areas separated by at least one dicing area, wherein the at least one dicing area includes a plurality of closely adjacent projections defining a depression therebetween;

covering the plurality of device areas with a mask layer;

etching the at least one dicing area using said mask layer as a mask to remove the plurality of projections;

forming a conductive layer over the semiconductor substrate including the at least one dicing area from which the projections have been removed;

forming an insulating layer over the conductive layer;

forming openings in the insulating layer; and forming bump electrodes in the openings of said insulating layer.

2. A method of manufacturing a semiconductor device, comprising:

providing a semiconductor substrate having a principal surface which includes a plurality of device areas separated by at least one dicing area, wherein the at least one dicing area includes a plurality of closely adjacent projections defining a depression therebetween;

covering the plurality of device areas with a mask layer;

etching the at least one dicing area using said mask layer as a mask to partially etch the plurality of projections, wherein a dimension of the depression is reduced;

forming a conductive layer over the semiconductor substrate including the at least one dicing area from which the projections have been partially etched;

forming an insulating layer over the conductive layer;

forming openings in the insulating layer; and forming bump electrodes in the openings of said insulating layer.

3. A method of manufacturing a semiconductor device, comprising:

providing a semiconductor substrate having a principal surface which includes a plurality of device areas separated by at least one dicing area, wherein the at least one dicing area includes a plurality of closely adjacent projections defining a depression therebetween;

forming a metal film over the principle surface of the semiconductor substrate including within the depression defined by the closely adjacent projections of the at least one dicing area;

forming a low viscosity first resist film over a surface of the metal film including within the depression; and forming a high viscosity second resist film over a surface of said first resist film.

* * * * *